(12) United States Patent
Pierno et al.

(10) Patent No.: US 8,860,608 B2
(45) Date of Patent: Oct. 14, 2014

(54) PHOTONIC ASSISTED DIGITAL RADAR SYSTEM

(75) Inventors: Luigi Pierno, Rome (IT); Massimiliano Dispenza, Rome (IT); Alessandro Gatta, Rome (IT); Annamaria Fiorello, Rome (IT); Alberto Secchi, Rome (IT); Massimo Ricci, Rome (IT)

(73) Assignee: Selex Sistemi Integrati S.p.A., Rome (IT)

( * ) Notice: Subject to any disclaimer, the term of this patent is extended or adjusted under 35 U.S.C. 154(b) by 300 days.

(21) Appl. No.: 13/447,435

(22) Filed: Apr. 16, 2012

(65) Prior Publication Data
US 2013/0016004 A1    Jan. 17, 2013

(30) Foreign Application Priority Data
Apr. 15, 2011  (IT) .............................. TO2011A0336

(51) Int. Cl.
G01S 13/86    (2006.01)
G01S 13/02    (2006.01)
G01S 7/28     (2006.01)
H03M 1/12     (2006.01)

(52) U.S. Cl.
CPC .............. *G01S 13/02* (2013.01); *G01S 13/865* (2013.01); *G01S 7/28* (2013.01); *H03M 1/1245* (2013.01)
USPC ........................................... 342/195; 342/54

(58) Field of Classification Search
CPC ......... G01S 13/865; G01S 7/28; H01Q 3/267; H01Q 3/2676; H03K 17/78; H03M 1/12
USPC .............................................. 342/195, 52, 54
See application file for complete search history.

(56) References Cited

U.S. PATENT DOCUMENTS

| | | | |
|---|---|---|---|
| 4,097,148 A * | 6/1978 | Fry .............................. | 356/5.07 |
| 4,929,956 A | 5/1990 | Lee et al. | |
| 5,051,754 A | 9/1991 | Newberg | |
| 5,117,239 A | 5/1992 | Riza | |
| 5,854,804 A * | 12/1998 | Winer et al. .................. | 372/38.1 |
| 6,326,910 B1 * | 12/2001 | Hayduk et al. ................ | 341/137 |
| 6,771,201 B1 | 8/2004 | Currie | |

(Continued)

OTHER PUBLICATIONS

Fork, R.L.; Riasati, V.R., "Application of semiconductor lasers to agile optical phased arrays," Vertical-Cavity Lasers, Technologies for a Global Information Infrastructure, WDM Components Technology, Advanced Semiconductor Lasers and Applications, Gallium Nitride Materials, Processing, and Devi , vol., No., pp. 27,28, Aug. 11-13, 1997.*

*Primary Examiner* — John B Sotomayor
(74) *Attorney, Agent, or Firm* — Marshall, Gerstein & Borun LLP

(57) ABSTRACT

A photonic-assisted digital radar system comprising an active electronically-scanned antenna; a transmitting section comprising a waveform generator to generate a modulating signal; and a modulator to receive a transmission carrier and the modulating signal and to modulate the transmission carrier by means of the modulating signal; and a receiving section comprising a photonic-assisted analog-to-digital converter to convert electric analog signals into electric digital signals; and a digital signal processor to receive and process the electric digital signals. The photonic-assisted analog-to-digital converter comprises a mode-locked laser to generate an optical clock signal; and an electronic analog-to-digital converter; wherein the electronic analog-to-digital converter, the waveform generator, the modulator and the digital signal processor are configured to operate based on electric clock signals generated based on the optical clock signal.

7 Claims, 5 Drawing Sheets

(56) References Cited

U.S. PATENT DOCUMENTS

| | | | |
|---|---|---|---|
| 7,307,266 B1 * | 12/2007 | Sun et al. | 250/551 |
| 7,492,795 B1 * | 2/2009 | Delfyett et al. | 372/29.011 |
| 7,809,222 B2 * | 10/2010 | Hartl et al. | 385/122 |
| 7,898,464 B1 | 3/2011 | Anderson et al. | |
| 8,446,305 B1 * | 5/2013 | Zanoni et al. | 341/137 |
| 8,466,831 B2 * | 6/2013 | Pierno et al. | 342/174 |
| 2007/0159369 A1 * | 7/2007 | Currie et al. | 341/144 |
| 2010/0201345 A1 * | 8/2010 | Gupta et al. | 324/96 |
| 2011/0221627 A1 * | 9/2011 | Pierno et al. | 342/54 |
| 2013/0016004 A1 * | 1/2013 | Pierno et al. | 342/195 |

* cited by examiner

PHOTONIC ASSISTED DIGITAL RADAR SYSTEM

CROSS-REFERENCE TO RELATED APPLICATIONS

This application claims the benefit of Italian Patent Application No. TO2011A 000336, filed Apr. 15, 2011.

TECHNICAL FIELD OF THE INVENTION

The present invention relates to a photonic-assisted digital radar system, and in particular to a multirole, multifunctional radar equipped with an active electronically-scanned antenna (AESA), to which the following description will refer without losing in generality.

STATE OF THE ART

As is known, for example, from U.S. Pat. No. 5,117,239, radar systems comprise an antenna configured to receive and transmit RF (radiofrequency) signals; a transmitting section connected to the antenna and configured to generate and transmit RF signals by means of the antenna; and a receiving section connected to the antenna and configured to receive and process RF signals received from the antenna, shift them to base band or to an intermediate frequency, and convert them into corresponding digital signals, which are then appropriately processed.

In particular, the transmitting section comprises a waveform generator (WG), configured to generate a modulating signal constituted by a pulsed waveform; and a modulator, configured to modulate a carrier with the modulating signal and supply the RF signal thus generated to the antenna for transmission.

The receiving section comprises instead an analog-to-digital converter (ADC) configured to receive the RF signals received by the antenna or the corresponding base band or intermediate frequency signals and convert them into digital signals; and a digital signal processor (DSP) configured to receive and process the digital signals supplied by the analog-to-digital converter and appropriately process them.

The analog-to-digital conversion of the RF signals received by the antenna includes a sampling thereof by means of a sampling signal supplied by an appropriate electronic clock device. Currently, the maximum sampling frequency which can be reached is in the order of a few GHz mainly due to the electromagnetic interferences to which the analog-to-digital converters are prone during the operation thereof and to the performance limitations of the electronic devices used, and therefore this type of analog-to-digital conversion architecture is in fact not usable in all those applications in which sampling in the order of several tens of GHz is needed.

For this purpose, the use of electronic analog devices instead of digital devices in the receiving section has been suggested. However, such a solution is not practical because the non-linear behavior and the high phase noise introduced by the electronic analog devices cause a limitation of the performance of the radar systems both in terms of signal reception and in terms of coherent data processing.

OBJECT AND SUMMARY OF THE INVENTION

The present invention originates from the idea of using known photonic-assisted analog-to-digital converters in radar systems, wherein an electric analog signal to be converted into digital is first converted into a corresponding optical signal, then optically sampled, and then reconverted into a corresponding electric digital signal.

In this type of analog-to-digital converters, the electronic analog signal modulates a pulsed optical carrier constituted by light pulses of duration in the order of picoseconds ($10^{-12}$ s), this being an operation which corresponds to an optical sampling of the electric analog signal, and the optical signal thus generated is then converted into an electric digital signal by means of appropriate electro-optical converter devices, typically photodiodes.

An example of a photonic-assisted analog-to-digital converter is described in U.S. Pat. No. 6,771,201.

The Applicant has thus conducted an in-depth study aimed at identifying an architecture of the reception and transmission sections which, by exploiting the features of the photonic-assisted analog-to-digital converters allows to improve the performance of the radar systems as a whole.

According to the present invention, a photonic-assisted digital radar system is provided, as claimed in the appended claims.

In broad outline, in the photonic-assisted digital radar system according to the present invention an optical clock signal generated by a single mode-locked laser device (MLL device) in the photonic-assisted analog-to-digital converter is used for both carrying out the photonic-assisted analog-to-digital conversion as described above and for advantageously timing a plurality of electronic devices present in the photonic-assisted digital radar system.

DETAILED DESCRIPTION OF PREFERRED EMBODIMENTS OF THE INVENTION

The present invention will now be described in detail with reference to the accompanying figures in order to allow a person skilled in the art to make it and use it. Various changes to the described embodiments will be immediately apparent to a person skilled in the art, and the described generic principles may be applied to other embodiments and applications without therefore departing from the scope of protection of the present invention, as defined in the appended claims.

Thus, the present invention must not be considered limited to the described and illustrated embodiments but instead confers the broadest scope of protection, in accordance with the principles and features described and claimed herein.

Figure 1:
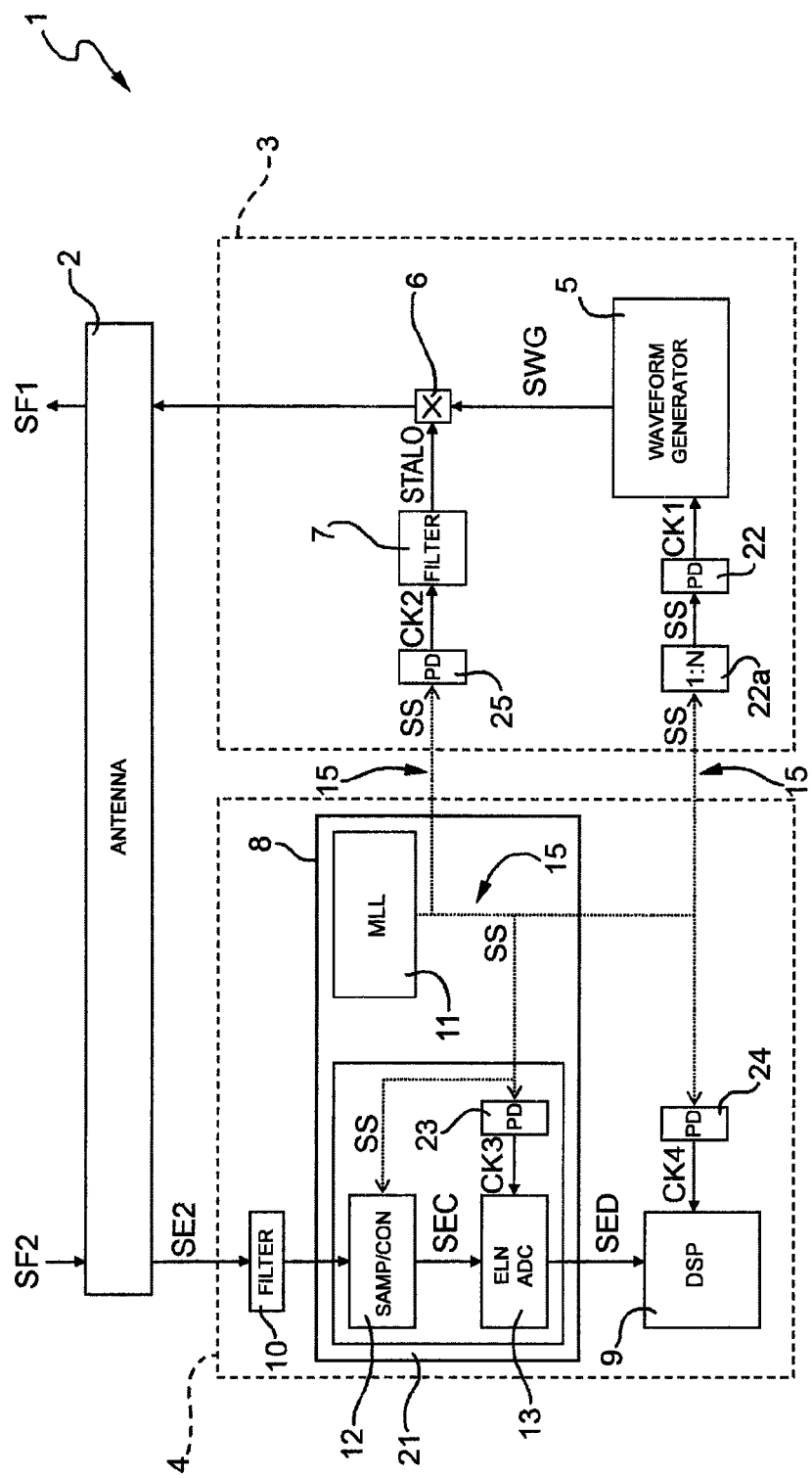
FIG. 1 diagrammatically shows a photonic-assisted digital radar system, made according to the dictates of the present invention.

With reference to FIG. 1, reference numeral 1 indicates as a whole a photonic-assisted digital radar system essentially comprising: an antenna 2; a transmitting section 3 connected to the antenna 2 and configured to generate and transmit RF signals SF1 by means of the antenna 2 itself; and a receiving section 4 connected to the antenna 2 and configured to receive and process the RF signals SF2.

The antenna 2 is of the active electronically-scanned type, also known as "phased-array" antenna, comprising a plurality of antenna subarrays configured to generate an antenna beam which scans the space to allow to carry out multiple radar functions, such as for example airspace surveillance, and/or target tracking functions and/or missile guiding functions and/or electronic war (EW) functions.

In particular, the phased-array antenna may comprise a fixed antenna, or a revolving antenna, which is coupled to a frame or supporting base (not shown) by means of electro-mechanical revolving members, e.g. a revolving joint (of the known type and not shown), structured to revolve the antenna with respect to the support base about a predetermined revolution axis (not shown), preferably a vertical axis.

According to a preferred embodiment shown in FIG. 1, the transmitting section 3 comprises a waveform generator 5 configured to generate a pulsed waveform constituted by a modulating electric signal SWG comprising a sequence of electric transmission radar pulses; and a mixer 6, which is configured to receive in input an electric transmission carrier STALO and the modulating signal SWG so as to generate the RF signal SF1 to be transmitted by means of the antenna 2.

In particular, the waveform generator 5 is configured so as to receive as input an electrical clock signal CK1 and time the generation of the electric transmission pulses which compose the electric modulating signal SWG on the basis of the received electric clock signal CK1.

The mixer 6 is connected to the output of a filter 7, e.g. a band-pass filter, which is, in turn, configured so as to receive an electrical clock signal CK2 as input, and appropriately filters the electronic clock signal CK2 itself so as to supply the transmission carrier STALO to the modulator 6.

With reference to the embodiment shown in FIG. 1, the receiving section 4 comprises a photonic-assisted analog-to-digital converter 8, which receives an electric analog signal SE2, echo of the RF signal SF2, from the antenna 2 by means of a pass-band pre-selector type filter 10, carries out an optical sampling of the electric analog signal SE2 so as to obtain a sampled optical signal SO1, and converts the sampled optical signal SO1 into a corresponding electric digital signal.

In other words, the photonic-assisted analog-to-digital converter 8 is configured to modulate by means of the electric analog signal SE2 a pulsed optical carrier constituted by light pulses in the order of picoseconds ($10^{-12}$ s) to obtain an optical sampling of the analog signal SE2 itself, operating in a high frequency electric analog signal domain SE2, i.e. comprised in a first band of frequencies, indicated hereinafter as "broad band" associated to the overall operative band of the radar system 1, and corresponding to a frequency interval comprised between approximately 0 and 20-40 GHz, preferably 0-35 GHz;

converting the sampled optical signal SO1, obtained from the sampling, into an electric analog sampled signal SEC;

digitalizing the electric analog sampled signal SEC so as to obtain an electric digital signal SED, operating both in the domain of the optical signals SO1, and in the domain of the electric analog sampled signals SEC, at an intermediate frequency comprised in a second frequency band, indicated hereinafter as "instantaneous band", associated to the operative band actually available in reception.

In the description above it is worth noting that if the analog signal in the operating band SE2 is a fractional narrow band, the extensions of the instantaneous band may even be lower than the operating band for some functions.

In such a case, the photonic-assisted analog-to-digital converter 8 downsamples the analog signal SE2 thus obtaining the intermediate bands sampled optical signal SO1. Implicitly, the photonic-assisted analog-to-digital converter 8 carries out a down-conversion in the "instantaneous band" of the electric analog sampled signal SEC.

The receiving section 4 is further provided with a processing unit comprising, for example, a digital signal processor 9, which is configured to receive and appropriately process the electric digital signal SED.

Figure 2:
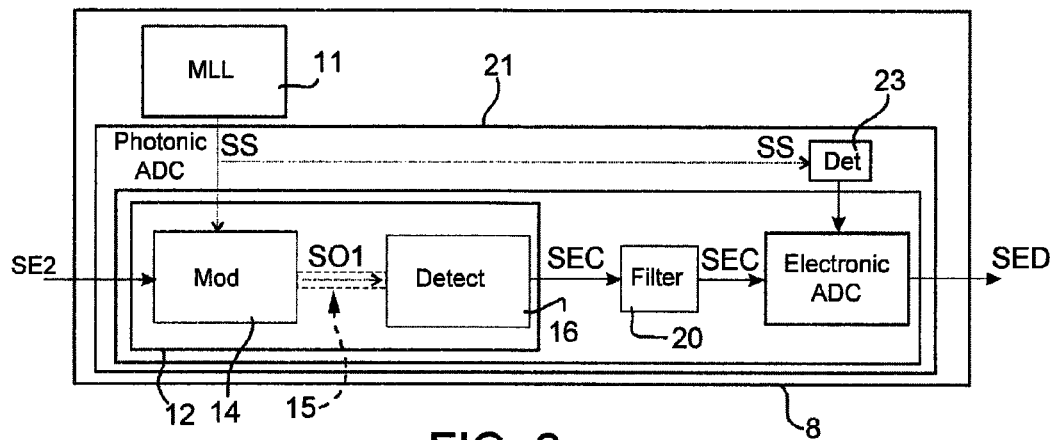
FIG. 2 diagrammatically shows a photonic-assisted analog-to-digital converter used in the photonic-assisted digital radar system shown in FIG. 1.

In the preferred embodiment shown in FIGS. 1 and 2, the photonic-assisted analog-to-digital converter 8 comprises a mode-locked laser device 11, which is configured to generate the optical clock signal SS comprising a sequence of light pulses, each having a duration in the order of picoseconds ($10^{-12}$ s); and a photonic-assisted analog-to-digital conversion stage 21, which comprises, in turn, an electro-optical sampler-converter 12, which receives the electric analog signal SE2 and the optical clock signal SS as input and outputs an electric analog sampled signal SEC; and an electronic analog-to-digital converter 13, which receives the electric analog sampled signal SEC as input, and is configured so as to convert the electric analog sampled signal SEC into the electric digital signal SED.

In particular, the electro-optical sampler-converter 12 is configured to modulate a pulsed optical carrier corresponding to the optical clock signal SS on the basis of the electric analog signal SE2 so as to generate the sampled optical signal SO1 comprising the optical samples associated to the electric analog signal SE2, and converts the sampled optical signal SO1 itself into the electric analog sampled signal SEC comprising the electric samples associated to the optical samples.

According to the preferred embodiment shown in FIG. 2, the electro-optical sampler-converter device 12 is provided with an electro-optical modulating unit 14, preferably comprising a Mach-Zender modulator, which has an optical input connected to the output of the mode-locked laser device 11 by means of optical means 15 for receiving the optical clock signal SS; an electric signal connected to the filter 10 to receive the electric analog signal SE2; and an output generating the sampled optical signal SO1.

In particular, the electro-optical modulating unit 14 is configured to modulate the pulsed optical carrier on the basis of the electric analog signal SE2 so as to generate the sampled optical signal SO1.

In the description above it is worth noting that the pulsed optical carrier SS used by the electro-optical modulating unit 14 may have a frequency lower than the radar signal frequency SF2, if it is fractional narrow band, and thus the radar signal SF2 may be subjected to downsampling. This is possible, by maintaining a high dynamic of the electric analog sampled signal SEC, by virtue of the high time stability of the pulsed optical carrier SS (jitter rms <10^-14 sec).

The electro-optical sampler-converter device 12 is further provided with an electro-optical detection unit 16, which is optically coupled to the electro-optical modulating unit 14, by means of optical means 15, for receiving in the latter the sampled optical signal SO1, and unlike the converter described in U.S. Pat. No. 6,771,201, is configured to convert the sampled optical signal SO1 into the electric analog sampled signal SEC operating with electronic converters ADC 13 available at instantaneous band frequencies.

According to the preferred embodiment shown in FIG. 2, the electro-optical detection unit 16 may be provided with at least one electro-optical converter comprising a photodiode (not shown), which is controlled by electronic control means (not shown) to time the conversion of the sampled optical signal SO1 into the electric analog sampled signal SEC.

The photonic-assisted analog-to-digital converter 8 further comprises a filter 20, e.g. a Nyquist anti-aliasing low-pass filter, which receives as input the electric sampling signal SEC and filters the latter in the instantaneous band so as to input it to the electronic analog-to-digital converter 13.

According to the preferred embodiment shown in FIGS. 1 and 2, the optical clock signal SS generated by the mode-locked laser device 11, in addition to being conveniently used by the radar system 1 as pulsed optical carrier for obtaining the sampled optical signal SO1 by modulating, is advantageously used to obtain the electric clock signals CK1, CK3, CK4 used by the waveform generator 5, by the electronic analog-to-digital converter 13 and by the signal digital processor 9, respectively.

For this purpose, the radar system 1 comprises a series of electro-optical detection units 22, 23 and 24, which have an input optically connected to the output of the mode-locked laser device 11 by means of optical means 15 for generating the optical clock signal SS, and output the respective electric clock signals CK1, CK3 and CK4, to be supplied to the waveform generator 5, to the electronic analog-to-digital converter 13, and to the digital signal processor 9, respectively.

In other words, the waveform generator 5, the electronic analog-to-digital converter 13, and the digital signal processor 9 operate, i.e. are timed, independently from each other, on the basis of corresponding electric clock signals CK1, CK3 and CK4 respectively, each of which is obtained from the optical clock signal SS, preferably, but not necessarily by means of an appropriate frequency adaptation/reduction.

In the case in point, the electro-optical detection unit 22 is connected to the mode-locked laser device 11 by means of a frequency splitter device 22a (splitting 1:N), which is configured to receive as input the optical clock signal SS so as to output it at a reduced frequency, thus suited for generating the electric clock signal CK1 to be supplied to the waveform generator 5.

According to the preferred embodiment shown in FIG. 1, the optical clock signal SS generated by the mode-locked laser device 11, in addition to being used by the radar system 1 as pulsed optical carrier of the optical signal SO1 and clock reference for generating electric clock signals CK1, CK3 and CK4, is conveniently used for generating the electric clock signal CK2 used to generate the electric transmission carrier STALO to supply to the modulator 6.

For this purpose, the radar system 1 comprises a further electro-optical detection unit 25, which has an input optically connected to the output of the mode-locked laser device 11, by means of optical means 15 to receive the optical clock signal SS, and outputs the electric carrier STALO which it supplies to the modulator 6, by means of the filter 7.

In the description above it is worth noting that the architecture of the electro-optical detection units 22, 23, 24 and 25 is substantially similar to the electro-optical detection unit 16, i.e. may be provided with an electro-optical converter comprising a photodiode configured to convert (in known manner and thus not described in detail) the light pulses into electric pulses having an appropriate reduced frequency according to the timing of the electronic device to which they are supplied, while the optical means 15 may be made by means of wave guides comprising optical filters for transmitting the optical clock signal SS.

In the description above, it is further worth noting that the frequency of the electric clock signal CK2 used for generating the electric carrier STALO to be inputted to the mixer 6 is different from the frequency of the optical clock signal SS (the two signals cannot be multiples) so as to ensure a correct execution of the optical sampling by means of an electro-optical modulating unit 14 and the electro-optical detection unit 16.

The receiving section 4 of the radar system 1 described above may be advantageously made according to different architectures, in each of which an optical clock signal SS generated by the single mode-locked laser device 11 present in the photonic-assisted analog-to-digital converter 8 is used for both carrying out the photonic-assisted analog-to-digital conversion of the electric sampling signal SE2 analog into the digital signal SED and for generating the electric clock signals CK1, CK2, CK3 and CK4.

Figure 3:
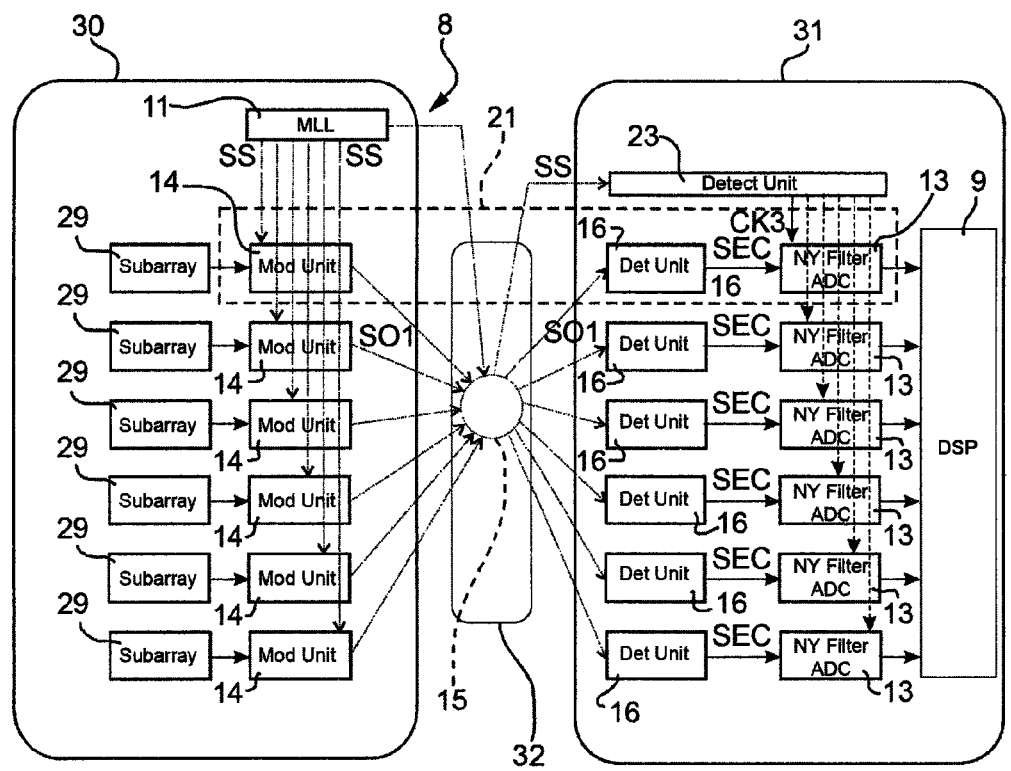
FIG. 3 diagrammatically shows a first architecture of the photonic-assisted digital radar system made according to the dictates of the present invention.
Figure 4:
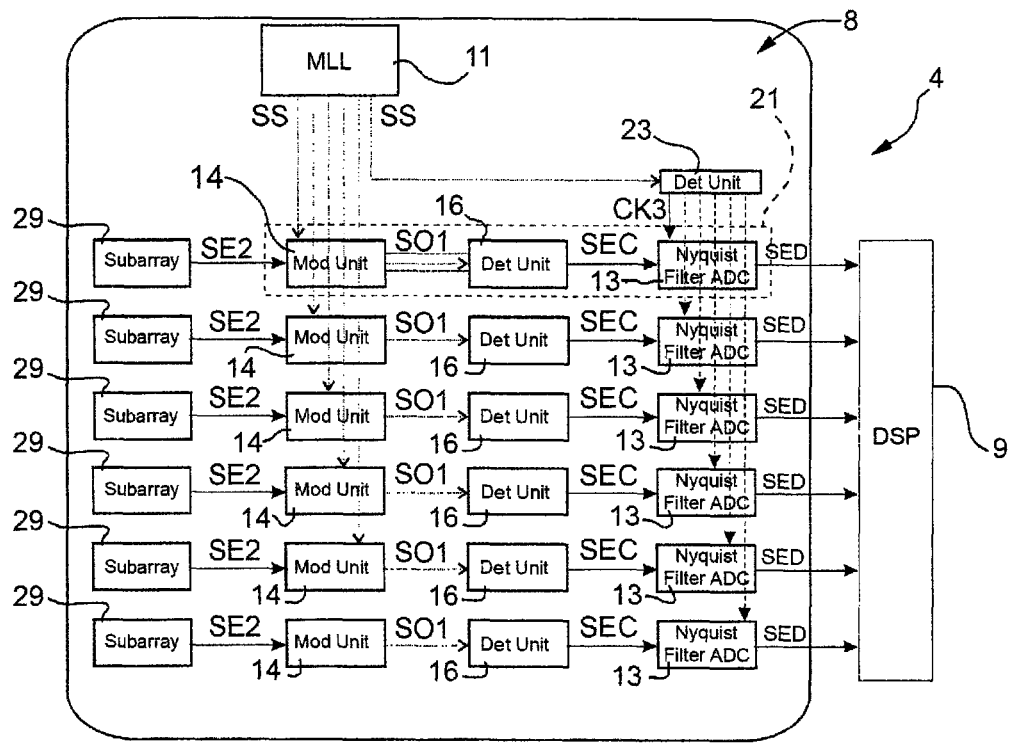
FIG. 4 diagrammatically shows a second architecture of the photonic-assisted digital radar system made according to the dictates of the present invention.

FIGS. 3 and 4 diagrammatically show two possible different photonic-assisted architectures of the receiving section 4 of a radar system 1, wherein the active electronically-scanned antenna 2 comprises a plurality of antenna subarrays 29 connected to the digital signal processor 9 by means of a photonic-assisted analog-to-digital converter 8 which comprises the mode-locked laser device 11 generating the optical clock signal SS and a plurality of photonic-assisted analog-to-digital conversion stages 21, each of which connects a relative antenna subarray 29 to the digital signal processor 9, and is adapted to receive a pulsed optical carrier obtained on the basis of the optical clock signal obtained on the basis of the optical clock signal SS generated by the single mode-locked laser device 11.

In particular, the architecture of the receiving section 4 shown in FIG. 3 finds advantageous, but not exclusive application in so-called "multirole" radar systems 1, i.e. systems equipped with a multichannel active electronically-scanned receiving antenna 2, and known as "M-AESA radars" (Multirole Active Electronically Scanned Array—M-AESA).

In the preferred embodiment shown in FIG. 3, the antenna 2 comprises a revolving antenna portion indicated by reference numeral 30, in which the antenna subarrays are housed 29; and a fixed antenna portion, indicated by reference numeral 31, which accommodates the digital signal processor 9, and may be arranged under the revolving portion 30 so as to form the support base of the revolving antenna itself or, alternatively, may be arranged in a remote portion with respect to the revolving antenna 30 portion itself.

The receiving section 4 of the multichannel active electronically-scanned antenna 2 shown in FIG. 3 has an architecture in which the photonic-assisted analog-to-digital conversion stages 21 associated to the antenna subarrays 29 each have the respective electro-optical modulating unit 14 housed in the revolving antenna portion 30, while the remaining components, i.e. the electro-optical detection unit 16 and the electronic analog-to-digital converter 13 are arranged in the fixed antenna portion 31.

In particular, the architecture of the receiving section 4 of the active electronically-scanned antenna multi-receiver includes that the mode-locked laser device 11 is housed in the revolving antenna portion 30, while the electro-optical detection unit 23 generating the electric clock signals CK3 to be supplied to the electronic analog-to-digital converters 13 is housed in the fixed antenna portion 31.

The architecture of the receiving section 4 of the active electronically-scanned multi-receiver antenna 2 further includes that the sampled optical signal SO1 generated by each electro-optical modulating unit 14 and the optical clock signal SS generated by the mode-locked laser device 11 are communicated to the electro-optical detection unit 16 and to the electro-optical detection unit 23, respectively, by means of the optical means 15 arranged in the revolving joint 32 coupled to the revolving antenna portion 30 and/or to the fixed antenna portion 31.

Furthermore, it is worth noting that the electric sampling signals SEC are advantageously processed by the digital signal processor 9 which is arranged in a remote position with respect to the position of the revolving antenna portion 30, while the flow of light pulses which form the sampled optical signal SO1 and cross the optical means 15 in the revolving joint 32 may be obtained by means of modulating techniques of the Wavelength Domain Multiplexing type.

Instead, the architecture of the receiving section 4 shown in FIG. 4 finds advantageous, but not exclusive application in M-AESA radar systems 1 provided with a fixed type active electronically-scanned multi-receiver antenna 2, thus provided with a fixed antenna portion 31.

In particular, the architecture shown in FIG. 4 differs from the architecture shown in FIG. 3 because the fixed antenna portion 31 houses: the antenna subarrays 29, the mode-locked laser device 11 and the photonic-assisted analog-to-digital conversion 21 associated to the antenna subarrays 29.

In the description above it is worth emphasizing that the architectures shown in FIGS. 3 and 4 are both conveniently adapted to be used in M-AESA radar systems because they allow to obtain the antenna beam associated to the antenna subarrays 29 directly in the electric digital domain, conveniently by using a single optical clock signal in the antenna "front-end", available by virtue of the presence of the mode-locked laser device 11 contained in the photonic-assisted analog-to-digital converter 8.

Figure 5:
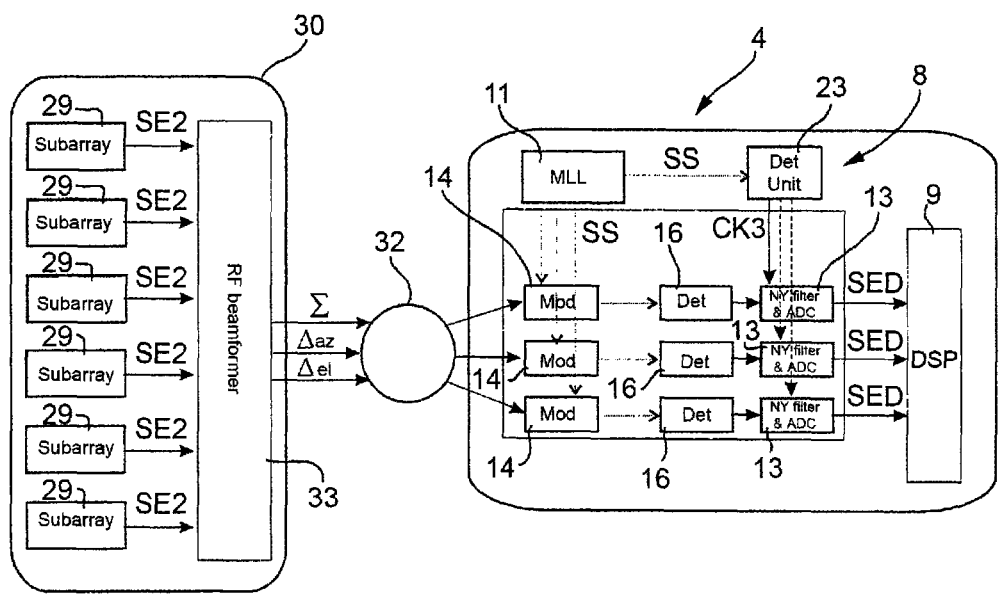
FIG. 5 diagrammatically shows a third architecture of the photonic-assisted digital radar system made according to the dictates of the present invention.

FIG. 5 diagrammatically illustrates a different architecture of the receiving section 4 of a radar system 1, in which the multi-receiver active electronically-scanned antenna comprises an analog RF beamformer device 33 operating in the RF signal domain, which receives as input the electric analog signals SE2 associated to the RF signals SF2 received from the antenna subarrays 29, and is configured to combine the electric analog signals SE2 themselves (in known manner and therefore not described in detail) to output three electric analog signals Σ, Δaz, and Δel, which are indicative of the angular form (Gaussian form etc.), the swinging angle or azimuth and the elevation angle of the antenna beam, respectively.

The architecture shown in FIG. 5 further includes a photonic-assisted analog-to-digital converter 8 provided with three photonic-assisted analog-to-digital conversion stages 21, which receive in input the optical clock signal SS generated by the mode-locked laser device 11, and the three analog signals Σ, Δaz, Δel, and output the electric signals Σ, Δaz, Δel in the digital format to be fed to the digital signal processor 9 which processes them to determine the required radar information.

Similarly to the architecture shown in FIG. 3, the architecture shown in FIG. 5 finds advantageous, but not exclusive application in the M-AESA radar systems 1 provided with a revolving antenna portion 30, a fixed antenna portion 31 and a revolving joint 32.

In particular, the revolving antenna portion 30 houses the antenna subarrays 29 and the analog RF beamformer device 33, while the fixed antenna portion 31 houses the mode-locked laser device 11, the three photonic-assisted analog-to-digital conversion stages 21, the electro-optical detection unit 23 configured to provide the electric clock signals CK3 to each electric analog-to-digital converter 13 on the basis of the optical clock signal SS produced by the mode-locked laser device 11; and the digital signal processor 9.

The beam signals Σ, Δaz, and Δel generated by the analog RF beamformer device 33 are supplied to the photonic-assisted analog-to-digital converter 8 by means of the electric means (not shown) arranged in the revolving joint 32.

Figure 6:
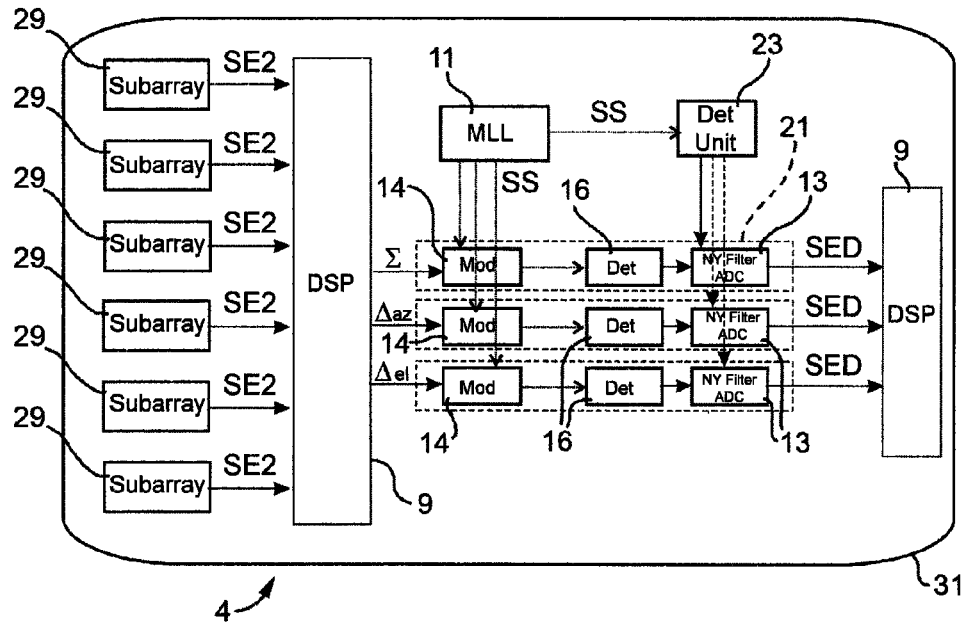
FIG. 6 diagrammatically shows a fourth architecture of the photonic-assisted digital radar system made according to the dictates of the present invention.

Similarly to the architectures shown in FIG. 4, the architecture of the receiving section 4 shown in FIG. 6 finds advantageous, but not exclusive application in M-AESA radar systems 1 provided only with a fixed antenna portion 31.

In particular, the architecture shown in FIG. 6 differs from the architecture shown in FIG. 5 because, on one hand, it does not include the use of a revolving joint and, on the other hand, the fixed antenna portion 31 also houses the electro-optical detection unit 22, the mode-locked laser device 11 and the three photonic-assisted analog-to-digital conversion 8, in addition to the antenna subarrays 29 and the analog RH beamformer device 33.

Figure 7:
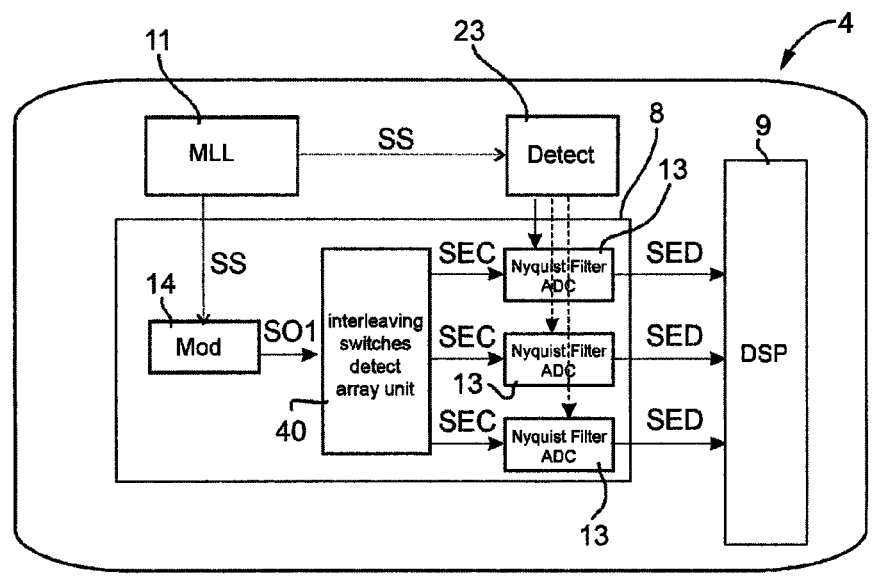
FIG. 7 diagrammatically shows a fifth architecture of the photonic-assisted digital radar system made according to the dictates of the present invention; while FIG. 8 diagrammatically shows a sixth architecture of the photonic-assisted digital radar system made according to the dictates of the present invention.

FIG. 7 diagrammatically shows a different architecture of the receiving section 4 of a radar system 1, advantageously, but not exclusively applicable in instantaneously broad band radar applications, such as, for example, electronic war applications, or M-AESA antenna systems.

In particular, in the architecture shown in FIG. 7, the photonic-assisted analog-to-digital conversion stage 21 comprises an interleaving switch detect unit 40, which is configured so as to: receive in input the sampled optical signal SO1 generated by the electro-optical modulation unit 14 on the basis of a sampling frequency associated to the optical clock signal SS; and implements a parallelization of the sampled optical signal SO1 so as to obtain/output a plurality of electric analog sampling signals SEC having frequencies lower than the optical sampling frequency.

The interleaving switch detect unit 40 supplies the analog electric sampling signals SEC to a plurality of electronic analog-to-digital converters 13, which convert them into electric digital signals SED. Such electronic converters ADC may have an operating band which is the tenth of that of the sampling contained in SO1.

The electronic analog-to-digital converters 13 operate on the basis of electric clock signals CK3 obtained by means of an electro-optical detection unit 23, which may be configured, in turn, so as to manage the sequence of high speed optical pulses of the optical clock signal SS generated by the mode-locked laser device 11 by means of modulating techniques of the WDM (Wavelength Division Multiplexing) type or of the TDM (Time Division Multiplexing) type.

Figure 8:
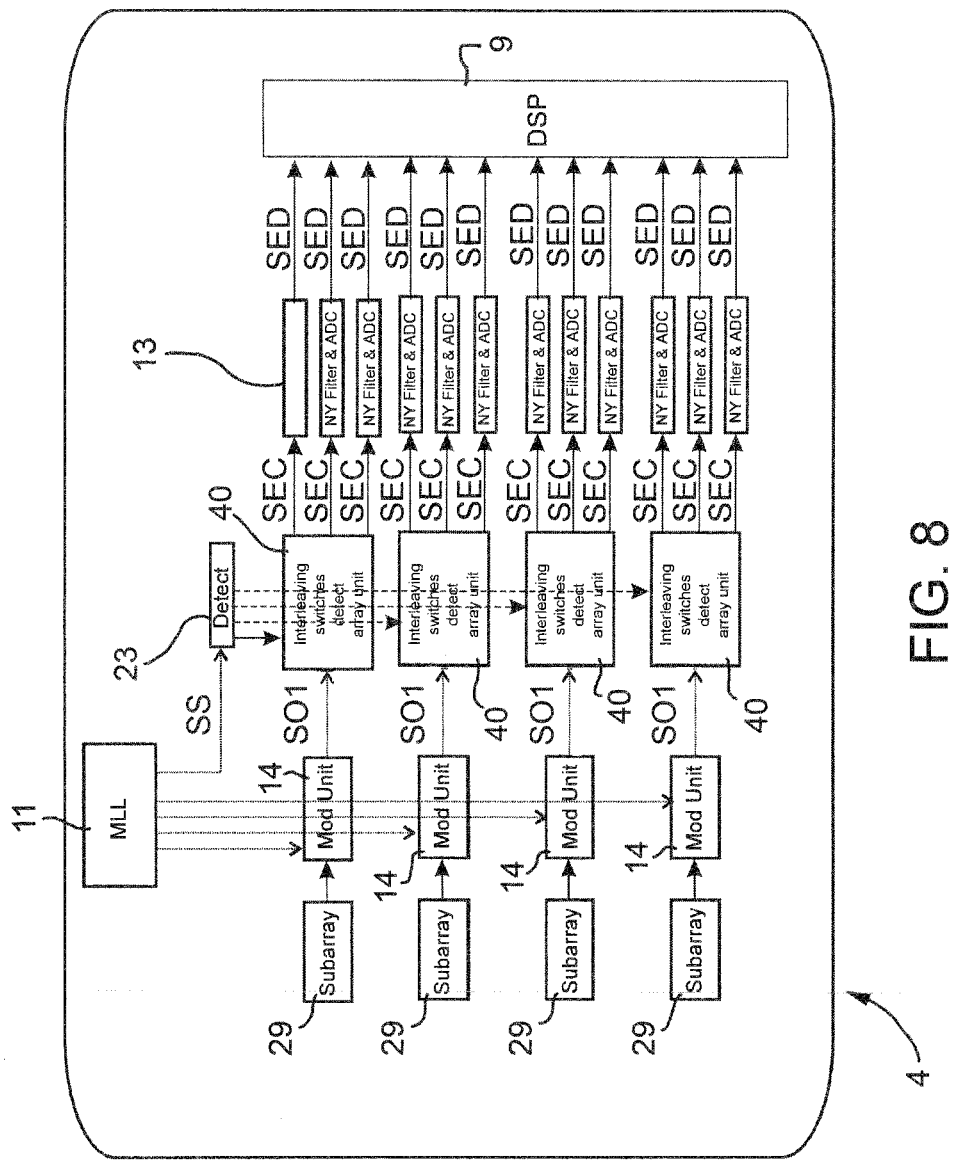

FIG. 8 shows a possible application of the architecture shown in FIG. 7 in a radar system 1 provided with an active electronically-scanned multi-receiver antenna 2 comprising a plurality of antenna subarrays 29.

The antenna subarrays 29 are connected to the digital signal processor 9 by means of a plurality of photonic-assisted analog-to-digital conversion stages 21, each of which is provided with an interleaving switch detect unit 40.

In the description above it is worth specifying that the receiving section 4 of the radar system 1 shown in FIG. 8, by virtue of the configuration described above allows to advantageously reduce the sampling speed of the electronic analog-to-digital sampling converter 13 and thus obtain a better dynamic, i.e. a better actual effective number of bits ENOB at the output of the electronic analog-to-digital converters 13 themselves.

The radar system described above is extremely advantageous because, in addition to carrying out the complete digitalization of the RF radar signal in a broad band, allows to use the optical clock signal generated by the MLL present in the photonic-assisted analog-to-digital converter to obtain the electric clock signals present in the radar system itself. The use of the optical clock signal further determines a drastic reduction of the electromagnetic interference with respect to the known radar systems.

It is finally apparent that changes and variations can be made to that described and illustrated above without departing from the scope of protection of the present invention, as defined in the appended claims.

The invention claimed is:

1. A photonic-assisted digital radar system (1) comprising:
    an active electronically-scanned antenna (2);
    a transmitting section (3) connected to the antenna (2) and configured to generate and transmit RF signals (SF1) via the antenna (2); and
    a receiving section (4) connected to the antenna (2) and configured to receive and process electric analog signals (SE2) associated to received RF signals (SF2);
    the transmitting section (3) comprising:
    a waveform generator (5) configured to generate an electric modulating signal in the form of a pulsed waveform (SWG); and
    a modulator (6) configured to receive an electric transmission carrier (STALO) and the electric modulating signal (SWG) and to modulate the transmission carrier (STALO) by means of the modulating signal (SWG), thereby generating a radiofrequency signal (SF1) to be transmitted via the antenna (2);
    characterized in that the receiving section (4) comprises:
    photonic-assisted analog-to-digital converting means (8) configured to convert electric analog signals (SE2) into corresponding electric digital signals (SED); and
    digital signal processing means (9) configured to receive and process the electric digital signals (SED);
    wherein the photonic-assisted analog-to-digital converting means (8) comprises:
    a mode-locked laser device (11) configured to generate an optical clock signal (SS); and
    electronic analog-to-digital converting means (13);
    the electronic analog-to-digital converter means (13), the waveform generator (5), the modulator (6) and the digital signal processing means (9) being configured to operate based on respective electric clock signals (CK3), (CK1),(CK2),(CK4) generated based on the optical clock signal (SS).

2. A system according to claim 1, wherein the photonic-assisted analog-to-digital converting means (8) comprises at least one photonic-assisted analog-to-digital converting stage (21) comprising:
    at least one modulating unit (14) configured to modulate an optical pulsed carrier obtained based on the optical clock signal (SS) by means of an electric analog signal (SE2) associated to an RF signal (SF2) received by the antenna (2), thereby generating an optical sampled signal (SO1) containing samples of the electric analog signal (SE2) received by the antenna (2);
    at least one electro-optical detection unit (16) configured to convert an optical sampled signal (SO1) into a corresponding electric analog sampled signal (SEC);
    at least one electronic analog-to-digital converter (13) configured to convert the electric analog sampled signal (SEC) into a corresponding electric digital signal (SED) for the digital signal processing means (9).

3. A system according to claim 1, wherein a frequency of the optical clock signal (SS) is lower than, and not a submultiple of, a frequency of a received RF signal (SF2); the photonic-assisted analog-to-digital converting means (8) being configured to sub-sample the corresponding electric analog signal (SE2), so as to carry out a down-conversion of the instantaneous frequency band of the electric analog sampled signal (SEC) and obtain the optical sampled signal (SO1) with an intermediate frequency band.

4. A system according to claim 2, wherein the antenna (2) is designed to house at least one electro-optical modulating unit (14) operable to generate the optical sampled signal (SO1), and at least one interleaving device (40) configured to receive the optical sampled signal (SO1) from the electro-optical modulating unit (14); parallelize the optical sampled signal (SO1) to output a plurality of electric analog sampled signals (SEC) with frequencies lower than a frequency of the optical clock signal (SS); and supply the electric analog sampled signals (SEC) to corresponding electronic analog-to-digital converters (13) operable to convert the electric analog sampled signals (SEC) into corresponding electric digital radar signals (SED).

5. A system according to claim 2, wherein the antenna (2) is a phased array antenna comprising a fixed antenna base (31) and an antenna portion (30) rotatably mounted on the antenna base (31) and comprising a plurality of antenna subarrays (29), each of which is configured to output an electric analog signal (SE2) associated to a corresponding RF signal (SF2) received by the antenna subarray (29);
    the antenna portion (30) being designed to house the mode-locked laser device operable to generate the optical clock signal (SS);
    the antenna base (31) being designed to house:
    a plurality of electro-optical detecting units (16) configured to receive sampled optical signals (SO1) from the corresponding electro-optical modulating units (14) through optical means (15) arranged in a rotary joint (32) associated to the antenna portion (30), and to convert the sampled optical signals (SO1) into corresponding electric analog sampled signals (SEC);
    a plurality of electronic analog-to-digital converters (13) configured to operate based on corresponding electric clock signals (CK3) obtained based on the optical clock signal (SS) to convert the electric analog sampled signals (SEC) associated to the sampled optical signals (SO1), into respective electric digital signals (SED); e
    digital signal processing means (9) configured to process the electric digital signals (SED).

6. A system according to claim 2, wherein the antenna (2) comprises a fixed antenna portion (31) configured to house:
    the mode-locked laser device (11);
    a plurality of photonic-assisted analog-to-digital converting stages (21) configured to receive the electric analog signals (SE2) associated to the RF signals (SF2) received by the antenna subarrays (29); optically sample the electric analog signals (SE2) to obtain corresponding sampled optical signals (SO1); convert the sampled optical signals (SO1) into corresponding electric analog sampled signals (SEC); and then convert the electric analog sampled signals (SEC) associated to the sampled optical signals (SO1) into corresponding electric digital signals (SED).

7. A system according to claim 2, wherein the antenna (2) is a phased array antenna comprising a fixed antenna base (31) and an antenna portion (30) rotatably mounted on the antenna base (31) and comprising a plurality of antenna subarrays (29), each of which is configured to output an electric analog signal (SE2) associated to a corresponding RF signal (SF2) received by the antenna subarray (29);

the antenna portion (30) being designed to house:

the mode-locked laser device (11) operable to generate the optical clock signal (SS);

an analog RF beamformer device (33) configured to receive the electric analog signals (SE2) associated to the RF signals (SF2) which form the antenna beam and are received by the antenna subarrays (29); and to combine the electric analog signals (SE2) to output three electric analog signals ($\Sigma$), ($\Delta$az), and ($\Delta$el), which are indicative of the angular form, of the swinging angle or azimuth, and of the elevation angle of the antenna beam, respectively; and photonic-assisted analog-to-digital converting means (8) configured to receive the three electric analog signals ($\Sigma$), ($\Delta$az), ($\Delta$el) via electric means housed in a rotary joint (32) associated to the antenna portion (30); optically sample the three electric analog signals ($\Sigma$), ($\Delta$az), ($\Delta$el) to output three corresponding sampled optical signals; convert the three sampled optical signals into three corresponding electric analog signals ($\Sigma$s), ($\Delta$az), and ($\Delta$el); and convert the three electric analog signals ($\Sigma$), ($\Delta$az), and ($\Delta$el) into three corresponding electric digital signals (SED).

* * * * *